(12) United States Patent
Hashimoto et al.

(10) Patent No.: US 6,707,071 B2
(45) Date of Patent: Mar. 16, 2004

(54) SEMICONDUCTOR LIGHT-EMITTING DEVICE

(75) Inventors: Makiko Hashimoto, Ushiku (JP); Nobuyuki Hosoi, Ushiku (JP); Kenji Shimoyama, Ushiku (JP); Katsushi Fujii, Ushiku (JP); Yoshihito Sato, Ushiku (JP); Kazumasa Kiyomi, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 10/096,508

(22) Filed: Mar. 13, 2002

(65) Prior Publication Data

US 2002/0125488 A1 Sep. 12, 2002

Related U.S. Application Data

(62) Division of application No. 09/404,376, filed on Sep. 24, 1999, now Pat. No. 6,387,721.

(30) Foreign Application Priority Data

Sep. 25, 1998 (JP) .......................................... 10/271634

(51) Int. Cl.[7] .............................................. H01L 33/00
(52) U.S. Cl. ......................................... 257/94; 257/95
(58) Field of Search ..................... 257/94, 101; 372/44, 372/46

(56) References Cited

U.S. PATENT DOCUMENTS

| 4,951,289 A | * | 8/1990 | Shima .......................... 372/46 |
|---|---|---|---|
| 5,029,175 A | | 7/1991 | Ohnaka et al. |
| 5,399,885 A | * | 3/1995 | Thijs et al. .................... 257/95 |
| 5,474,954 A | | 12/1995 | Yang |
| 5,805,627 A | | 9/1998 | Kubota et al. |
| 6,487,226 B1 | * | 11/2002 | Iwamoto et al. .............. 372/46 |

FOREIGN PATENT DOCUMENTS

EP 0 867 949 A2 9/1998

OTHER PUBLICATIONS

Takayama T. et al. "800 MW Peak–Power Self–Sustained Pulsation Gaalas Laser Diodes" IEEE Journal of Selected Topics In Quantum Electronics, Us, IEEE Service Center, vol. 1, No. 2, pp 562–568 XP000521116.

European Search Report dated Feb. 1, 2000.

* cited by examiner

*Primary Examiner*—Douglas Wille
(74) *Attorney, Agent, or Firm*—Armstrong, Kratz, Quintos, Hanson & Brooks, LLP

(57) ABSTRACT

In a semiconductor light-emitting device including a substrate, a first compound semiconductor layer including an active layer formed on the substrate, a second compound semiconductor layer of a ridge type formed on the first compound semiconductor layer, and a protective film formed above the first compound semiconductor layer on both sides of the second compound semiconductor layer, the disclosed semiconductor light-emitting device has a current blocking layer formed above the first compound semiconductor layer outside the protective film. This semiconductor light-emitting device is with a high production yield since readily cleaved and assembled, with adequately squeezed currents, and with, when assembled in the junction-down type, a high output and a longer life span.

13 Claims, 11 Drawing Sheets

SEMICONDUCTOR LIGHT-EMITTING DEVICE

This application is a division of prior application Ser. No. 09/404,376 filed Sep. 24, 1999 Now U.S. Pat. No. 6,387,721.

BACKGROUND OF THE INVENTION

1. Field of the Invention

This invention relates to a semiconductor light-emitting device and a manufacturing method for the same. More particularly, this invention relates to a semiconductor light-emitting device of a ridge type having a current blocking layer at a specific portion and a manufacturing method for the same. The invented semiconductor light-emitting device is suitable for a semiconductor laser. In use of a structure of the semiconductor light-emitting device according to the invention, currents can be adequately squeezed, and production yield can be improved during cleavage and assembly. Besides a semiconductor light-emitting device having a high output and a longer life span can be provided when the device with this structure is assembled in a junction-down type.

2. Description of Related Art

FIG. 4 shows a structure of and a manufacturing method for a conventional ridge waveguide type stripe structure semiconductor laser device.

Here, and in the following claims, "conductive type" means the same as "conductivity type." As shown in FIG. 4(a), first, a first conductive type cladding layer 11, an active layer 12, a second conductive type cladding layer 13, and a second conductive type contact layer 14 are grown on a substrate 21. Secondly, the second conductive type contact layer 14 and the second conductive type cladding layer 13 are etched as shown in FIG. 4(b) to form a ridge portion. During this step, portions other than the ridge portion are etched to remain a prescribed thickness of the second conductive type cladding layer 13 located on the active layer 12. Protective film 31 made of an insulator is formed on the ridge portion side surfaces and surfaces other than the ridge portion to stop the current flowing. Lastly electrode 32 is formed on an epitaxial side including an area above the ridge portion and electrode 33 is formed on a substrate to produce the device (FIG. 4(c)).

With such a structure, the currents are injected into the active layer 12 via the ridge portion, and the generated light corresponding to the composition of the active layer 12 is generated at the active layer 12 below the ridge portion. Since the protective film 31 having a smaller refractive index than semiconductor portions is formed, the/effective refractive index of an active layer located below areas other than the ridge portion is smaller than the effective refractive index of the active layer below the ridge portion. Consequently, the generated light is confined in a light waveguide below the ridge portion.

Because in this ridge waveguide type stripe structure semiconductor light-emitting device, the ridge portion is formed by etching, it is difficult to control the thickness of the cladding layer portion of a non-ridge portion. Consequently, slight differences of the thickness of the cladding layer of the portions other than the ridge portion cause large fluctuations of the effective refractive index of the active layer of those portions. The width of the ridge bottom, which decides the width of current injection, is not controlled, and therefore, it is difficult to produce lasers having a low threshold and a constant off-angle with good reproducibility.

To solve such problems, a method has been proposed in which the thickness of the cladding layer over the active layer is decided by the crystal growth rate during a crystal growth, in which an isolation layer is formed on areas other than the ridge portion, and in which the ridge portion is re-grown at the ridge portion (e.g., Japanese Unexamined Patent Publication No. 5-121,822, Japanese Unexamined Patent Publication No. 9-199,791). FIG. 5 shows a structure and a manufacturing method for such a laser device. First, after a first conductive type cladding layer 11, an active layer 12, and a second conductive type first cladding layer 13 are grown on the substrate 21 (FIG. 5(a)). Secondly, the surface of the second conductive type first cladding layer 13 is covered with a protective film 31 such as $SiO_2$ or the like, and a second conductive type second cladding layer 13a and a second conductive type contact layer 14a are selectively grown only at a stripe region after a stripe shape window is opened by a photolithography method (FIG. 5 (b)). Lastly, a protective film 31a such as $SiN_x$ is formed on side surfaces of the second conductive type second cladding layer 13a, the entire surface of the second conductive type contact layer 14a, and a protective film 31 covering areas other than the ridge portion. The $SiN_x$ protective film located on the top of the ridge portion is removed by a photolithography method. And electrode 32 is formed on the whole epitaxial surface and electrode 33 is formed on the substrate (FIG. 5(c)).

Where such a protective film or the like makes the current squeezing, there raise problems that cleavage cannot be made easily due to the surface covered by the protective film as well as peeling off of the electrodes may occur. When the protective film has pinholes or the like, currents may flow through portions other than the ridge portion and there raises a problem that the current cannot be injected at the ridge portion. When the device is assembled in a junction-down type, in which the substrate side is upper while the epitaxial layer side is lower, a soldering material may reach the compound semiconductor layers over the electrodes and the protective film, and there rises a problem that the current leakage may occur easily. Because the ridge portion is projecting from other regions, the device may be easily stressed and degraded. These are not in a favorable situation. The specification of U.S. Pat. No. 5,399,855 discloses a semiconductor light-emitting device having a dummy ridge structure higher than the ridge structure on both sides of the ridge structure. But since the dummy ridge structure is covered by an insulation layer, the above problems regarding cleavage or peeling of electrodes remain unsolved.

With the conventional ridge type waveguide structure semiconductor light-emitting device, even where produced by re-growth, the LD (laser diode) in which currents are squeezed by means of the protective film or the like, cleavage and assembly are not easy, and the currents may not be squeezed adequately by the protective film or the like, so that the production yield may be lowered. When the device is assembled in the junction-down type, the device likely invite the current leakage to areas other than the ridge portion or degradation due to stresses, so that the device hardly obtains adequate LD characteristics.

It is an object of the invention to provide a semiconductor light-emitting device with a high production yield since readily cleaved and assembled, with adequately squeezed currents, and with, when assembled in the junction-down type, a high output and a longer life.

SUMMARY OF THE INVENTION

This the inventors have found that, as a result of diligent researches for accomplishing the above object, the above discussed problems are solved by a semiconductor light-emitting device having a structure formed with a semiconductor layer as a current blocking layer outside a protective film formed on both sides of a ridge portion, and completed this invention.

That is, first, this invention is to provide a semiconductor light-emitting device, where including a substrate, a first compound semiconductor layer including an active layer formed on the substrate, a second compound semiconductor layer of a ridge type formed on the first compound semiconductor layer, and a protective film formed above the first compound semiconductor layer on both sides of the second compound semiconductor layer, has a current blocking layer formed above the first compound semiconductor layer outside the protective film.

Secondly, this invention is to provide a method for manufacturing semiconductor light-emitting device comprising the steps of: forming a first compound semiconductor layer including an active layer on a substrate, and a protective film on a center portion of the first compound semiconductor layer; forming a current blocking layer on the first compound semiconductor layer except the center portion; forming an opening in the protective film; and selectively growing a ridge type second compound semiconductor layer at the opening.

Thirdly, this invention is to provide a method for manufacturing semiconductor light-emitting device comprising the steps of: forming a first compound semiconductor layer including an active layer on a substrate and a current blocking layer in this order; removing a portion of the current blocking layer; forming a protective film having an opening at the removed portion; and selectively growing a ridge type second compound semiconductor layer at the opening.

According to this invention, with respect to the semiconductor light-emitting device having this ridge type waveguide structure, production yield during cleavage and assembly processes is improved because of no isolation layer for the purpose of squeezing the current, and the current can be adequately squeezed into the ridge portion since the current blocking layer exists outside the ridge opening. When the device is assembled in a junction-down type (see, FIG. 11(b)), the device can reduce the stresses to the ridge portion and achieve a high output and a longer lifetime, because the outside of the ridge portion is thicker than the ridge portion.

The semiconductor light-emitting device according to the invention can be used as a high output semiconductor laser by widening the width of the ridge bottom, and alternatively, can be used as a self-excited oscillation type semiconductor layer by narrowing the width of the ridge bottom, which can be used as one of preferable examples of the invention.

Figure 1A:
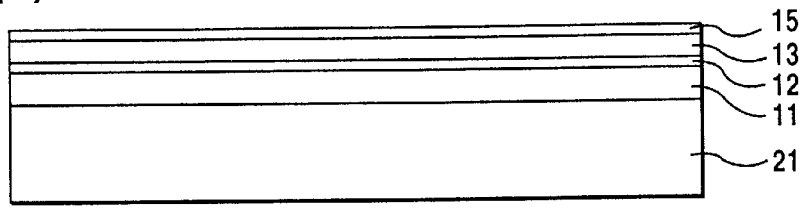
FIG. 1(a) is a cross section at a stage when a growth of a double-hetero (DH) structure for a semiconductor light-emitting device is finished, according to the embodiment of the invention in which a ridge portion is produced by re-growth.

As for reference numbers, numeral 11 is a first conductive type cladding layer; numeral 12 is an active layer; numeral 13 is a second conductive type first cladding layer; numeral 13a is a second conductive type second cladding layer; numeral 13b is a second conductive type second cladding layer formed in a dummy ridge layer; numerals 14, 14a are second conductive type contact layers; numeral 14b is a second conductive type contact layer formed in a dummy ridge layer; numeral 15 is an oxidation suppressive layer; numeral 16 is a current blocking layer; numeral 21 is a substrate; numeral 25 is a ridge portion; numeral 26 is a dummy ridge region; numeral 31 is a protective film; numeral 31a is a insulation layer; numeral 32 is an electrode on an epitaxial layer side; numeral 33 is an electrode on a substrate side; numeral 34 is a soldering material; numeral 35 is a heat sink; numeral 36 is a wire to which a bonding is made.

DETAILED DESCRIPTION OF THE INVENTION

Hereinafter, the invention is described in detail.

A semiconductor light-emitting device according to the invention includes a substrate, a first compound semiconductor layer including an active layer formed on the substrate, a second compound semiconductor layer of a ridge type formed on the first compound semiconductor layer, and a protective film formed on the first compound semiconductor layer on both sides of the second compound semiconductor layer. The feature of the invented semiconductor light-emitting device is in the formation of a current blocking layer formed above the first compound semiconductor layer outside the protective film.

In this specification, a phrase "B layer formed on A layer" includes not only a case that B layer is formed that a bottom of B layer touches a top of A layer, with also a case that B layer is formed on a top of some layers which are formed on A layer. The phrase also includes a case where a top of A layer touches a bottom of B layer at some regions and one or more layers exist between A layer and B layer at other regions. Specific embodiments can be apparent from embodiments and descriptions about respective layers.

The structure of the invention can be produced by re-growth. As shown in FIG. 1, a first compound semiconductor layer including an active layer firstly formed on a substrate generally includes layers having a smaller refractive index than that the active layer formed on and beneath the active layer, and the layer on a substrate side functions as a first conductive type cladding layer whereas the layer on the epitaxial layer side functions as a second conductive type cladding layer. The first compound semiconductor layer may include a layer functioning as an optical guide layer. The device generally has a double-hetero (DH) structure sandwiching the active layer by the two cladding layers, which structure is that the first conductive type cladding layer 11, the active layer 12, and the second conductive type first cladding layer 13 are formed on the substrate 21 in this order. An oxidation suppressive layer may be included on the second conductive type first cladding layer 13 in having a function to prevent the surface from oxidation, and for example, an oxidation suppressive layer may be formed directly on the cladding layer 13, which is preferable (see, FIG. 1(a)).

Figure 10:
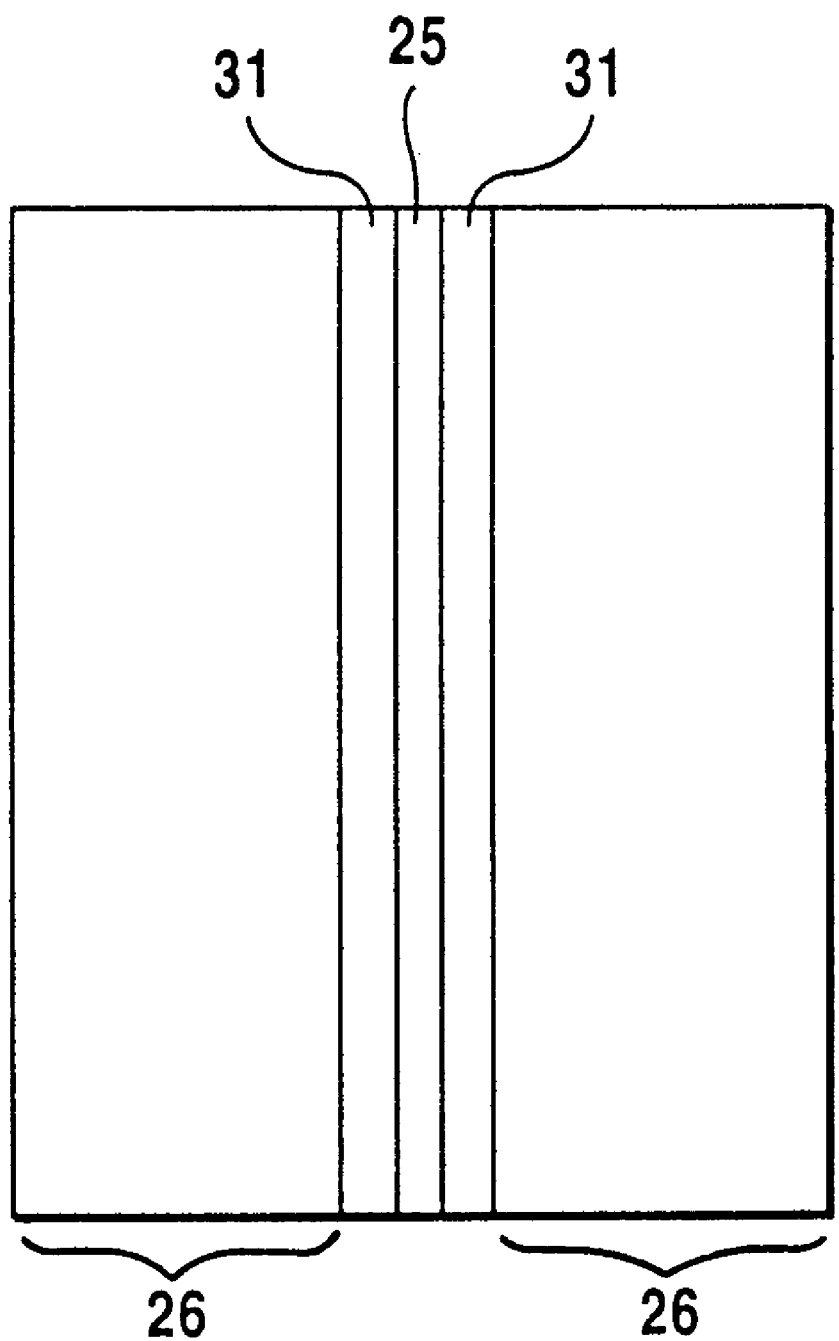
FIG. 10 is an illustration showing a semiconductor light-emitting device of the invention when seen from a side of an epitaxial layer; a ridge portion, protective films, and dummy ridge regions are shown in FIG. 10.
Figure 11A:
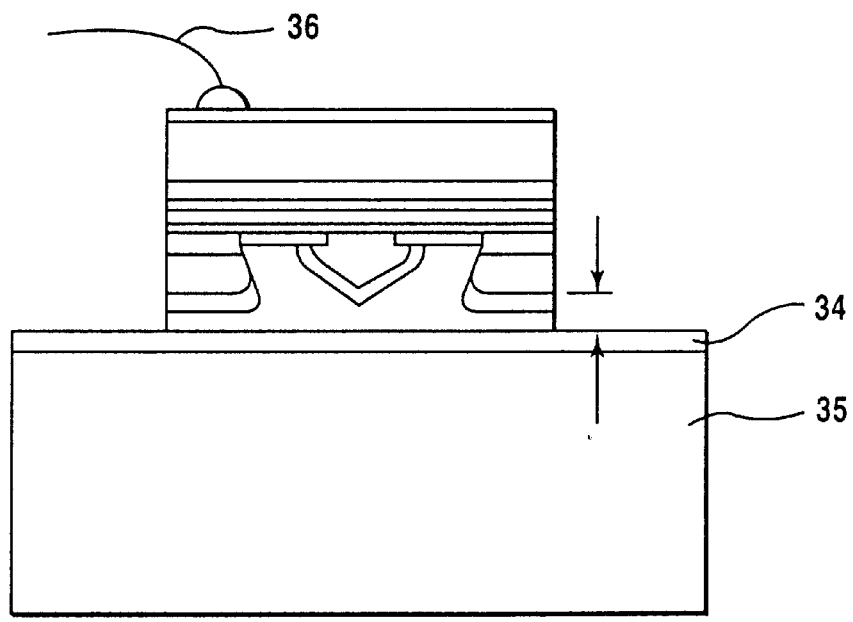
FIG. 11(a) is an illustration showing a semiconductor light-emitting device according to the invention assembled in a junction-down type.
Figure 11B:
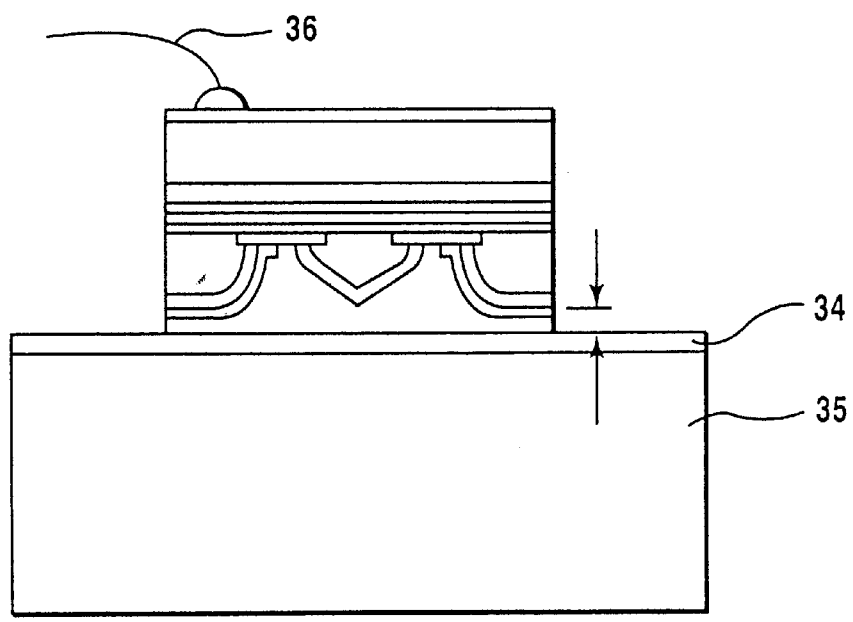
FIG. 11(b) is an illustration showing a semiconductor light-emitting device of a comparative example assembled in a junction-down type.
Figure 12:
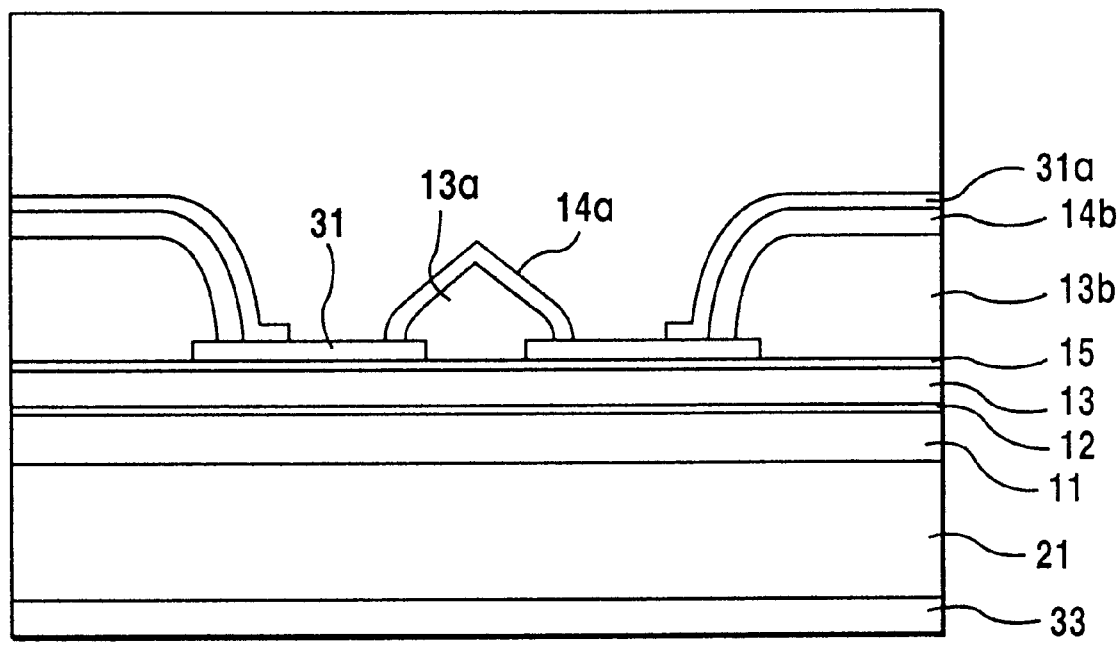
FIG. 12 is a cross section showing a completed semiconductor light-emitting device as a comparative example.

A protective film 31 as an insulation film is deposited subsequently. The protective film on to dummy ridge regions is removed by a photolithography method. The dummy ridge region is defined as a region located outside the protective film when seen from the epitaxial layer side as shown in FIG. 10 and including the epitaxial layer from the substrate. The region includes the epitaxial layer grown as riding on the protective film 31. A current blocking layer 16 is formed on the dummy ridge regions (FIG. 1(b)). To make an opening for forming a ridge the protection film is removed at a center portion of the protective film by a photolithography method. The shape of the opening is not limited to a stripe shape, and can be a form that, e.g., a part is widened or narrowed. Ridge type second compound semiconductor layers, namely, a second conductive type second cladding layer as a compound semiconductor layer having a low refractive index than that of the active layer and a contact layer for reducing resistance, are generally formed. The structure may include a layer functioning as a optical guide layer. By this processing, the second conductive type second cladding layer 13a and the contact layer 14a are deposited at the ridge portion, and the respective layers 13b, 14b corresponding to those are deposited at the dummy ridge region (FIG.(c)).

Figure 2A:
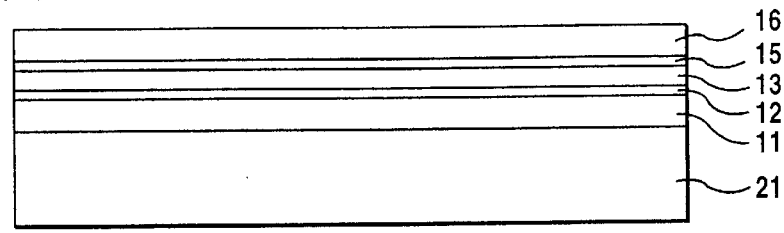
FIG. 2(a) is a cross section at a stage when growth of a double-hetero (DH) structure for a semiconductor light-emitting device is finished according to the embodiment of the invention in which a ridge portion is produced by re-growth.
Figure 2B:
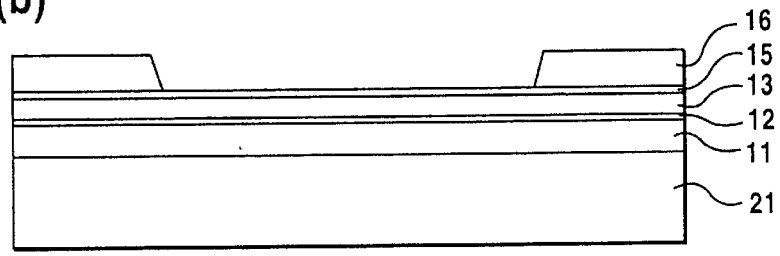
FIG. 2(b) is a cross section at a stage when re-growth of a current blocking layer for the semiconductor light-emitting device is finished according to the embodiment of the invention in which the ridge portion is produced by re-growth.
Figure 2C:
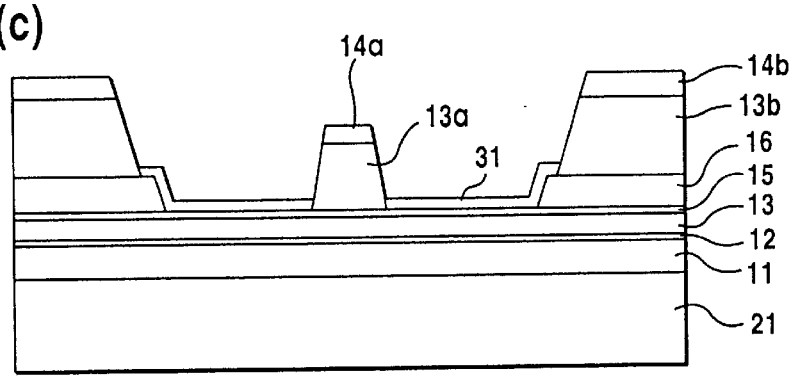
FIG. 2(c) is a cross section at a stage when re-growth for the ridge for the semiconductor light-emitting device is finished according to the embodiment of the invention in which the ridge portion is produced by re-growth.

As another manufacturing method, a first conductive type cladding layer 11, an active layer 12, a second conductive type first cladding layer 13, an oxidation suppressive layer 15 if necessary, and a layer 16 for forming a current blocking layer are formed as shown in FIG. 2 on a substrate 21 (FIG. 2(a)). Subsequently, regions for a ridge portion and a protective film are removed by using a photolithography method and an etching technology (FIG. 2(b)). A protective film 31 serving as an insulation film is deposited subsequently, and openings are formed at the ridge portion and the ridge dummy regions by the photolithography method. A second conductive type second cladding layer and a contact layer are formed thereon. By this formation, the second conductive type second cladding layer 13a and the contact layer 14a are deposited at the ridge portion, and the respective layers 13b, 14b corresponding to those are deposited at the dummy ridge region (FIG.(c)).

Figure 1B:
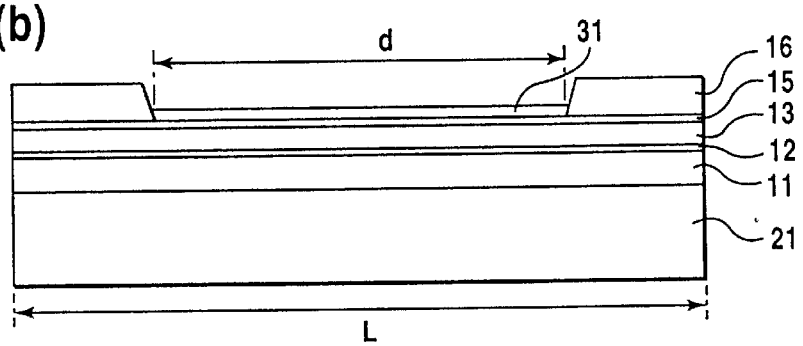
FIG. 1(b) is a cross section at a stage when re-growth of a current blocking layer for the semiconductor light-emitting device is finished according to the embodiment of the invention in which the ridge portion is produced by re-growth.
Figure 1C:
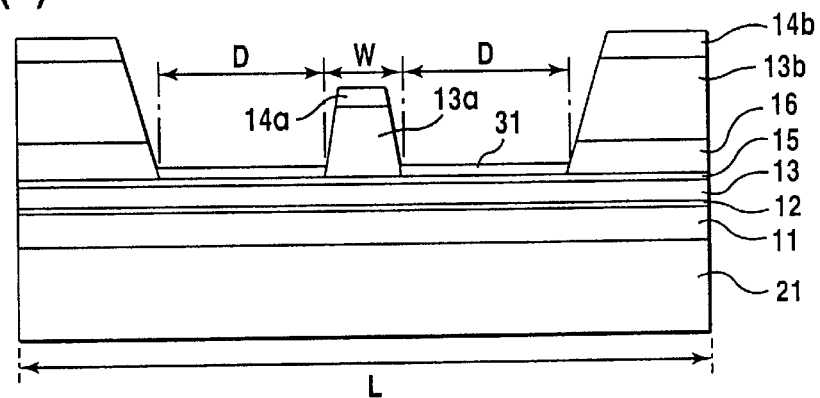
FIG. 1(c) is a cross section at a stage when re-growth of a ridge for the semiconductor light-emitting device is finished according to the embodiment of the invention in which the ridge portion is produced by re-growth.
Figure 1D:
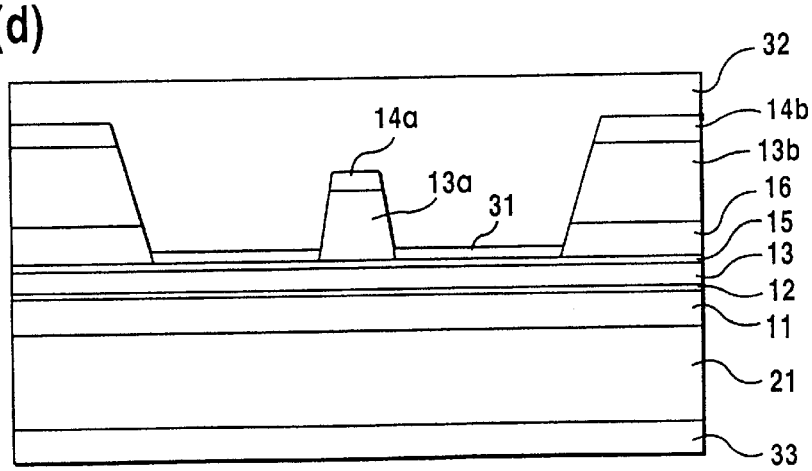
FIG. 1(d) is a cross section of the completed semiconductor light-emitting device according to the embodiment of the invention in which the ridge portion is produced by re-growth.
Figure 2D:
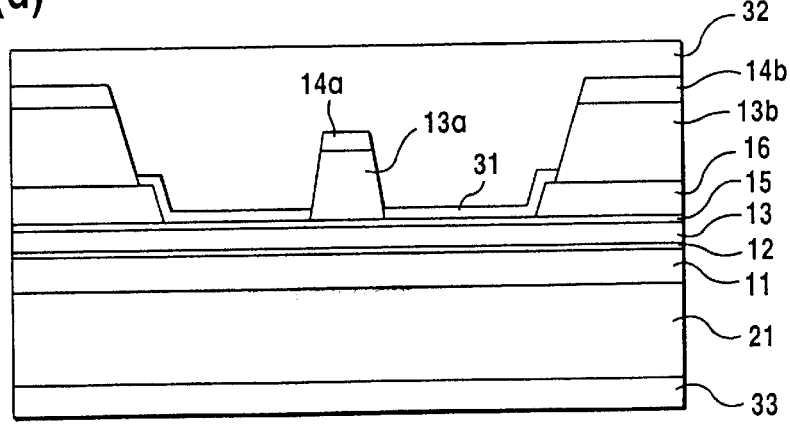
FIG. 2(d) is a cross section of the completed semiconductor light-emitting device according to the embodiment of the invention in which the ridge portion is produced by re-growth.

It is to be noted that in FIGS. 1(d), 2(d), numerals 32, 33 represent electrodes, which are deposited by a known method.

For formation of a double-hetero structure or re-growth, known growth methods such as a metal organic vapor phase epitaxy (MOVPE) or metal organic chemical vapor deposition (MOCVD), and molecular beam epitaxy (MBE) can be used. As for a substrate, what is a conductive material can be used, and it is preferable to use a semiconductor single crystal substrate such as GaAs, InP, Si, ZnSe, and the like because a crystal thin film is grown thereon. It is more preferable to use semiconductor crystal substrate having a zincblend type structure, and the crystal growth plane is preferably (100) plane or crystallographically equivalent planes. It is to be noted that in this specification, the (100) plane indicates not necessarily a strict (100) plane, and permits substrate having approximately a maximum 15° off-angle. The substrate can be of a hexagonal type substrate, and in such a case, it can be formed on $Al_2O_3$, 6H—SiC and the like.

There is no special limitation of the cladding layers, the active layer, the current blocking layer, and the second conductive type contact layer formed on the second conductive type second cladding layer for reducing contact resistance when necessary, but the DH structure can be formed using general III-V group and II-VI group semiconductors such as AlGaAs, AlGaInP, GaInPAs, AlGaInN, BeMgZnSSe and CdZnSeTe.

The current blocking layer can be a material inducing a laser oscillation only at the ridge portion by squeezing the currents into the ridge portion, and in regard with the thickness, if it is too thick, for example, the controllability for the ridge stripe width becomes worse, while if it is too thin, the device loses effects to avoid stresses to the ridge stripe portion when assembled in a junction-down type. Therefore, the thickness of the current blocking layer is 100 nm or thicker, preferably 300 nm or thicker, more preferably 500 nm or thicker as a lower limitation and 2000 nm or thinner, preferably 1500 nm or thinner, more preferable 1000 nm or thinner as an upper limitation. A preferable semiconductor light-emitting device can be produced by adjusting the thickness within a range having a lower limitation and an upper limitation which are respectively selected from the above depending on, for example, the intended use of the device.

The current blocking layer can be an isolation layer but preferably be a semiconductor layer. In such a case, it is preferable to form a first conductive type semiconductor layer or a high resistance semiconductor layer as the conductive type semiconductor layer. The carrier concentration is $1 \times 10^{17}$ cm$^{-3}$ or higher, preferably $5 \times 10^{17}$ cm$^{-3}$ or higher, more preferably $7 \times 10^{17}$ cm$^{-3}$ or higher as a lower limitation and $1 \times 10^{19}$ cm$^{-3}$ or lower, preferably $5 \times 10^{18}$ cm$^{-3}$ or lower, more preferably $3 \times 10^{18}$ cm$^{-3}$ or lower as an upper limitation. A preferable semiconductor light-emitting device can be produced by adjusting the carrier concentration within a range having a lower limitation and an upper limitation which are respectively selected from the above depending on, for example, the intended use of the device. To prevent the currents from leaking at boundaries between the protective film and the current blocking layer, it is preferable to form the current blocking layer as riding on the protective film.

The cladding layer can be made of a material having a refractive index smaller than that of the active layer. As a contact layer, a material having a band gap smaller than that of the cladding layer is generally selected, and to gain ohmic property to the electrode, the contact layer has a low resistance with a proper carrier concentration of, generally, $1 \times 10^{18}$ cm$^{-3}$ or higher, preferably $5 \times 10^{18}$ cm$^{-3}$ or higher as a lower limitation and $5 \times 10^{19}$ cm$^{-3}$ or lower, preferably $2 \times 10^{19}$ cm$^{-3}$ or lower as a higher limitation. A preferable semiconductor light-emitting device can be produced by adjusting the carrier concentration within a range having a lower limitation and an upper limitation which are respectively selected from the above depending on, for example, the intended use of the device.

A layer having a higher carrier concentration, even though made of the same material as the second conductive type second cladding layer, can be used as a contact layer, or the surface part of the second conductive type second cladding layer is made to have a higher carrier concentration part of and the surface part having the higher carrier concentration can be used as a contact layer.

The active layer may not be limited to a case that made of a single layer, including a single quantum well structure (SQW) made of a quantum well layer and optical guide layers sandwiching the quantum well layer between the above and below, and a multiquantum well structure (MQW) made of plural quantum well layers, barrier layers sandwiched by the quantum well layers, and optical guide layers stacked on the topmost quantum well layer and beneath the bottommost quantum well layer.

With a structure that the refractive index of the cladding layer of the ridge portion is set lower than that of the cladding layer on the active layer, deviations of the beam divergence angle, which is caused by deviations in the composition when the laser is produced can be reduced.

Regarding the protective film, there is no special limitation. It is required for the protective film to possess insulation property to inject currents only to a region of the active layer below the ridge portion formed on the opening of the protection layer and to squeeze the currents with the protective film located on both sides of the opening. It is also preferable that the refractive index of the protective film smaller than that of the cladding layer to give effective refractive index difference in the horizontal direction between the active layers below the ridge portion and below the protective film to stabilize the transverse mode of the laser oscillation. However, as a practical matter, if the refractive index difference is too large, because the second conductive type first cladding layer below the ridge portion has to be thick the effective refractive index step in the transverse direction in the active layers becomes large easily. On the other hand, if the refractive index difference is too small, the protective film has to be thick to some extent because light easily leaks outside the protective film, and therefore. However, this raises a problem that makes the cleavage worse. In considerations of the above matters, the refractive index difference between the protective film and the cladding layer is preferably 0.1 or more, more preferably 0.2 or more, further preferably 0.7 or more as a lower limitation and preferably 2.5 or less, more preferably 2.0 or less, further preferably 1.8 or less as an upper limitation. A preferable semiconductor light-emitting device can be produced by adjusting the refractive index difference within a range having a lower limitation and an upper limitation which are respectively selected from the above depending on, for example, the intended use of the device.

The protective film can have any thickness as far as the film can provide adequate insulation property and does not allow light to leak outside the protective film. The thickness of the protective film is preferably 10 nm or thicker, more preferably 50 nm or thicker, further preferably 100 nm or thicker as a lower limitation and preferably 500 nm or thinner, more preferably 300 nm or thinner, further preferably 200 nm or thinner as an upper limitation. A preferable semiconductor light-emitting device can be produced by adjusting the thickness within a range having a lower limitation and an upper limitation which are respectively selected from the above depending on, for example, the intended use of the device.

There is no special limitation to the width d (FIG. 1(b)) of the protective film when the protective film is grown and the repeating width L of the protective film (FIG. 1(b)), and when a ratio d/L of the width d and the repeating width L of the protective film is 0.002 or higher and 0.5 or lower, it is preferable because the thickness of the ridge and the carrier concentration can be controlled easily. Since an opening for forming a ridge portion to has to be formed in this protective film, if the difference between the width d of the protective film and the width W of the opening is small, it is hard to form an opening with good precision, and it is impossible to grow selectively the ridge portion and the dummy ridge regions riding over the protective film. At that time, the width D (FIG. 1(c)) of the protective film for re-growth of the ridge is set as d=2D+W. There is no special limitation to the width D of the protective film, but from the reasons above, the lower limitation is preferably 5 μm or wider, more preferably, 7 μm or wider, further preferably, 10 μm or wider, and with respect to the upper limitation, it is preferable to satisfy the ratio of d/L.

There is no special limitation to the width D of the protective film and the repeating width L of the ridge portion, and when a ratio D/L of the width D and the repeating width L of the protective film is 0.001 or higher and 0.25 or lower, it is preferable because the thickness of the ridge portion and the carrier concentration can be controlled easily. With respect to the width D of the protective film and the repeating width L of the ridge portion, it is preferable that the same width is used if all widths are same in the respective repeating units or the mean width is used if the width is fluctuated in the respective repeating units.

The protective film is preferably made of dielectrics, more specifically, selected from a group of SiNx film, $SiO_2$ film, SiON film, $Al_2O_3$ film, ZnO film, SiC film, and amorphous Si. The protective film is used for forming the ridge portion by selective re-growth using an MOCVD as a mask and also for squeezing currents. For simplifying the process, it is preferable to use the same composition film for both of the protective film for squeezing currents and the protective film for selective growth, but the composition can be different, and when necessary, multiple films having different compositions may be formed.

When the zincblend type substrate is used and the substrate surface is the (100) plane or crystallographically equivalent plane to the (100), it is preferable that the longitudinal direction of the stripe region preferably used as the opening of the protective film extends in the [01-1] direction or crystallographically equivalent directions to the [01-1], to facilitate the growth of the contact layer on the side surfaces of the ridge portion as described below. In such a case, of the ridge side surface frequently has a (311)A plane, so that the contact layer can be grown on substantially the whole surface, which can be grown, of the second conductive type second cladding layer for forming the ridge.

For the same reason, when a wurtzite type substrate is used, as a direction that the stripe region can extend, it is preferable to use, e.g., [11-20] or [1-100] direction on (0001) plane. For HVPE (Hydride Vapor Phase Epitaxy), any direction can be used, and for MOVPE, [11-20] direction is preferable.

This tendency is particularly remarkable when, e.g., a compound semiconductor including Al, Ga and As is used as structural elements, more particularly, when an AlGaAs compound semiconductor is used a cladding layer, and when the second conductive type second cladding layer is AlGaAs, particularly, with the AlAs mixed crystal ratio of preferably 0.2 or higher, more preferably 0.3 or higher, further preferably 0.4 or higher as a lower limitation and preferably 1.0 or lower, more preferably 0.9 or lower, further preferably 0.8 or lower as an upper limitation. A preferable semiconductor light-emitting device can be produced by adjusting the mixed crystal ratio within a range having a lower limitation and an upper limitation which are respectively selected from the above depending on, for example, the intended use of the device.

In this specification, the "[01-1] direction" is defined that the [11-1] plane existing between the (100) surface and the [01-1] plane is a plane at which the respective elements of V group and VI group appear from the general III-V group or the II-VI group semiconductor. It is not necessary to be a direction of [01-1] precisely, and it includes directions shifted with about ±10° from the [01-1] direction.

In the embodiment according to the invention, the stripe region is not limited to a situation of the [01-1] direction when the opening is in a stripe shape. Hereinafter, other embodiments are described. When the stripe region extends in the [011] direction or crystallographically equivalent directions to the [011], the growth speed can be anisotropic depending on, e.g., growth conditions, thereby a growth at (100) plane is made faster and a growth at (111) B plane is hardly made. In such a case, if a selective growth is made on a window (100) plane in a stripe shape, a ridge type second conductive type second cladding layer having (111)B plane as a side surface is formed. A contact layer may be formed entirely on a ridge top of (100) plane as well as on a ridge side surface of (111)B plane by selecting the growth conditions that a more isotropic growth occurs when a contact layer is formed subsequently.

When a III-IV group compound semiconductor layer is grown using an MOCVD method, the double-hetero structure is preferably formed at a growth temperature of around 700° C. and the V/III ratio of around 25 to 45, and the ridge portion is preferably formed at a growth temperature of around 630 to 700° C. and the V/III ratio of around 45 to 55. When the ridge portion selectively grown using the protective film is a III-V group compound semiconductor including Al such as AlGaAs or the like, introduction of HCl gas in a very small amount during the growth is very preferable because the gas prevents polymers or the like form depositing on protective film. In this situation, if the introduction amount of the HCl gas is too much, the AlGaAs layer does not be grown and conversely the semiconductor layer is etched (etching mode). The optimum HCl introduction amount greatly depends on a III group raw material supply mol number including Al such as trimethylaluminum or the like. More specifically, the ratio of the supply mol number of HCl to supply mol number of the group III source raw including Al (HCl/III group) is preferably 0.01 or more, more preferably 0.05 or more, further preferably 0.1 or more as a lower limitation and preferably 50 or less, more preferably 10 or less, further preferably 5 or less as an upper limitation. A preferable semiconductor light-emitting device can be produced by adjusting the the mol number within a range having a lower limitation and an upper limitation which are respectively selected from the above depending on, for example, the intended use of the device.

In addition to the invented structure, an oxidation suppressive layer that is hardly oxidized or that an oxide film can be easily removed if it was oxidized, can be formed on the re-growth surface of the double-hetero structure surface. As a structure that the refractive index of the cladding layer of the ridge portion is made smaller than that the cladding layer on the active layer, deviations of the beam divergence angle, caused by deviations of the composition during the laser production, can be reduced. In using the known methods such as an MOCVD method or the like, the cladding layer of the re-growth portion can be grown over the upper surface of the protection film, there the controllability of the beam distribution leaking to the vicinity of the protective film and the ridge portion is improved. The contact layer of the re-growth portion may be grown over the upper surface of the protective film, thereby prevents the side surface of the cladding layer from oxidizing, as well as increases the contact area between the contact layer and the electrode on a side of the epitaxial surface. The contact layer and the cladding layer of the re-growth portions can be grown individually or to ride over the top of the protective film. As described above, this invention is applicable to various ridge stripe type waveguide structure semiconductor light-emitting device, and this structure is also applicable to the facet light emission type LEDs.

In this invention, by forming the current blocking layer outside the protective film as an insulation film, an area in use of the insulation film can be reduced as much as possible, and therefore, because no insulation layer exists in a direction parallel to the resonator when cleaved, and because only a minimum insulation layer is located in a perpendicular direction, the cleavage can be made easily. The existence of the current blocking layer allows the dummy ridge region to be thicker than the ridge stripe portion, so that when assembled in a junction-down type, the device does not receive large stresses at the portion, so that any degradation can be prevented advantageously. From the existence of the current blocking layer, the dummy ridge region becomes a thyristor structure, so that current leakage can be prevented advantageously even if any soldering material adhere to the facet over an electrode when the device is assembled in the junction-down type.

Figure 3:
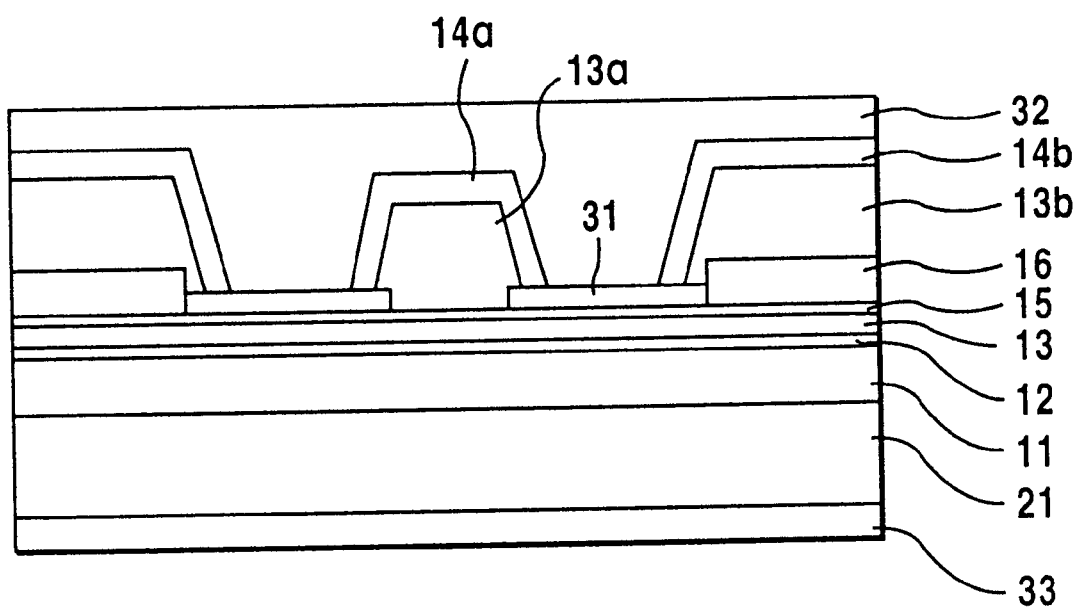
FIG. 3 is a cross section of one of completed semiconductor light-emitting devices according to as an invention in which the ridge portion is produced by a re-growth.
Figure 4A:
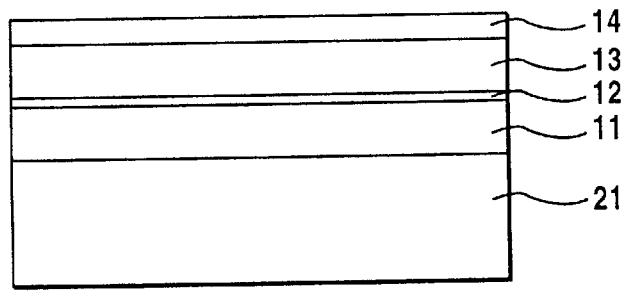
FIG. 4(a) is a cross section at a stage when a DH growth is finished for a conventional semiconductor light-emitting device in which a ridge portion is produced by etching.
Figure 4B:
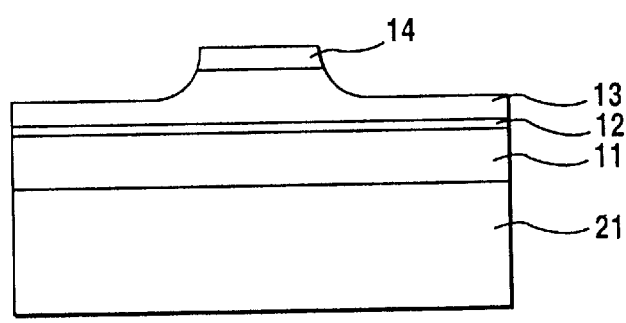
FIG. 4(b) is a cross section at a stage when an etching of a current blocking layer to make a ridge portion is finished for the conventional semiconductor light-emitting device in which the ridge portion is produced by etching.
Figure 4C:
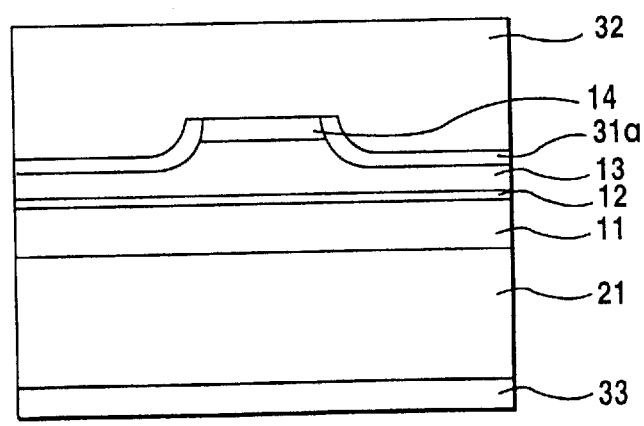
FIG. 4(c) is a cross section of the completed a conventional semiconductor light-emitting device in which a ridge portion is produced by etching.
Figure 5A:
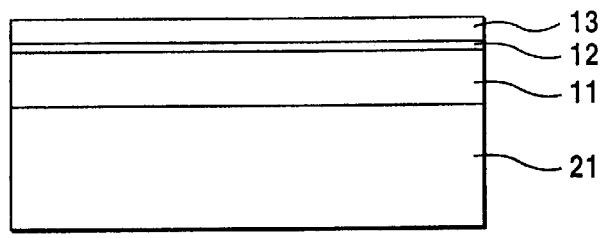
FIG. 5(a) is a cross section at a stage when a DH growth is finished for a conventional semiconductor light-emitting device in which a ridge portion is produced by re-growth.
Figure 5B:
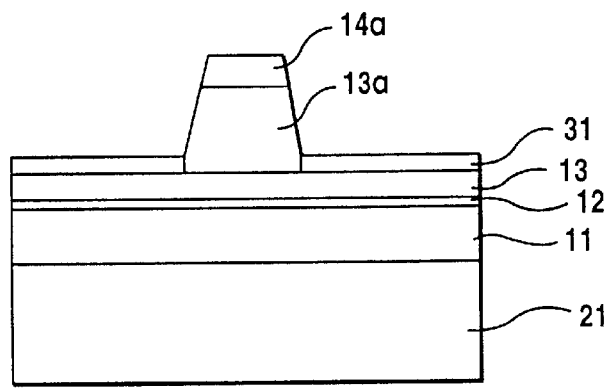
FIG. 5(b) is a cross section at a stage when re-growth of a ridge portion is finished for the conventional semiconductor light-emitting device in which the ridge portion is produced by re-growth.
Figure 5C:
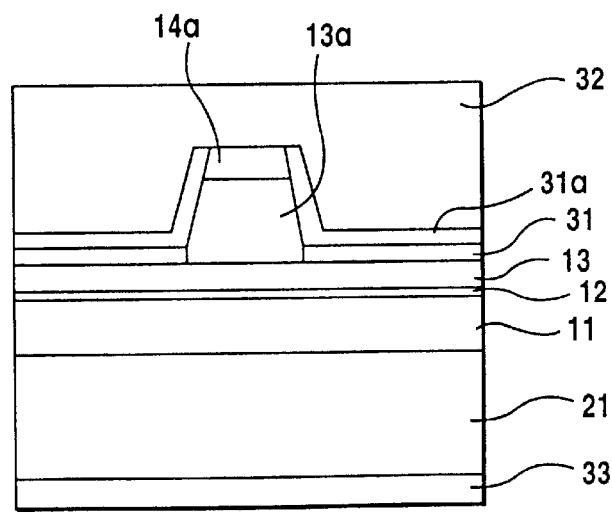
FIG. 5(c) is a cross section of the completed a conventional semiconductor light-emitting device in which a ridge portion is produced byre-growth.

As one of the best embodiments to apply this invention, as shown in FIG. 3, an oxidation suppressive layer 15 is formed on the DH surface; the cladding layer 13a and the contact layer 14a, which are re-grown, are grown as to ride over the protective film 31; the refractive index of the ridge portion cladding layer 13a is structured to be smaller than that of the cladding layer 13 on the active layer and the current blocking layer 16 is also made to ride over the protective film 31 like the ridge portion.

The ridge portion of the compound semiconductor layers is generally made of the second conductive type second cladding layer in the major portion, but it is preferable to form, on the entire surface such as side surfaces and top surfaces of the second conductive type second cladding layer, a contact layer having a lower resistance than other portions of the ridge portion. The device as a whole, thus, can be settled with a lower resistance by creating enough contact areas between the electrode and the second conductive type second cladding layer located adjacent to and via the contact layer.

It is to be noted that the side surface and the top surface of the ridge portion on which the contact layer is formed may be covered partially with a layer for oxidation suppressive purpose. In such a case, the entire device can be formed with a smaller resistance in comparison with forming electrodes without forming any contact layer on the ridge side surfaces, and to that extent, the invention includes the structure. Particularly, it is effective to reduce a resistance in the entire device with respect to materials having a high specific resistance such as AlGaInP based or AlGaInN based materials (particularly, p-type).

It is preferable, using known methods such as an MOCVD or the like as described above, that a part of the ridge portion of the compound semiconductor layer, as a re-grown second conductive type second cladding layer, rides over the protective film. The width of the overlapping portion of the second conductive type second cladding layer over the protective film is preferably 0.01 micron or wider, more preferably 0.1 or wider as a lower limitation and preferably narrower than 2.0 microns, more preferably 1.0 micron or narrower as an upper limitation. A preferable semiconductor light-emitting device can be produced by adjusting the width of the overlapping portion within a range having a lower limitation and an upper limitation which are respectively selected from the above depending on, for example, the intended use of the device. By this formation, the contact layer and the electrode can contact with each other with larger contact areas, so that the contact resistance can be reduced between the contact layer and the electrode, and so that the controllability of the beam distribution coming out of the vicinity of the boundary between the protective film and the ridge bottom portion can be improved.

When a contact layer having a smaller band gap than the energy of light emitted from the active layer is used, the light absorption of the contact layer formed on the ridge side surface can be reduced, thereby realizing improvements in laser characteristics and reliance. In such a case, a protective film may not be formed on the side surface of the ridge portion like a conventional ridge waveguide type laser, and in this invention, the protective film is formed at least in contact with the bottom of the side surface of the ridge portion, so that the process can be simplified and the costs can be effectively reduced.

With a desirable embodiment of the invention, the refractive index of the second conductive type first cladding layer is larger than that of the second conductive type second cladding layer. The difference in the refractive indexes between the second conductive type first cladding layer and the second conductive type second cladding layer is, as a lower limitation, generally equal to or larger than 0.005, preferably equal to or larger than 0.01, more preferably equal to or larger than 0.02, and as an upper limitation, generally equal to or smaller than 0.15, preferably equal to or smaller than 0.1, more preferably equal to or larger than 0.08. A preferable semiconductor light-emitting device can be produced by adjusting the difference within a range having a lower limitation and an upper limitation which are respectively selected from the above depending on, for example, the intended use of the device. With this structure, beam distribution to the ridge portion (near-field pattern) can be prevented from widening at the bottom, thereby achieving improvements in the symmetry of the vertical divergence angle (far-field pattern), the prevention of side peaks of a horizontal divergence angle (far-field pattern), and improvements of laser characteristics and reliance from suppression of a beam absorption at the contact layer.

According to another embodiment of the invention, an oxidation suppressive layer is formed at least directly below the opening in the protective film on the second conductive type first cladding layer, or namely, on the stripe region and, more preferably, both sides of the region. This can prevent a high resistance layer to increase a passing resistance at the re-growth interface from growing when the cladding layer of the ridge portion is formed by re-growth. If the impurities such as oxygen or the like exist in a large amount at the re-growth interface, beam absorption (heat generation) at the interface due to becoming worse crystal quality and promotion of impurities diffusions via defects can be induced, and therefore, characteristics and reliance may become worse. When an oxidation suppressive film is formed, the crystal quality can be prevented from becoming worse at the interface.

In this invention, when the ridge portion is in a stripe shape, and when the distance (dp) between the active layer and the protective film and the opening width (W) of the protective film are formed with good controllability in a proper range, a self-pulsation, which is widely sought in a field of information processing lasers, can be made. The proper range of dp is, as the upper limitation, 0.5 $\mu$m or shorter, preferably, 0.47 $\mu$m or shorter, more preferably 0.4 $\mu$m or shorter, and as the lower limitation, 0.2 $\mu$m or longer, preferably, 0.25 μm or longer, more preferably 0.3 μm or longer. The upper limitation of W is 3.0 μm or shorter, preferably, 2.7 μm or shorter, more preferably 2.5 μm or shorter, and as the lower limitation, 1.0 μm or longer, preferably, 1.3 μm or longer, more preferably 1.5 μm or longer. A preferable semiconductor light-emitting device can be produced by adjusting each of dp and W within a range having a lower limitation and an upper limitation which are respectively selected from the above depending on, for example, the intended use of the device.

This reasons are the followings. When the vertical divergence angle is too narrow, when the second conductive type first cladding layer is too thin and when the stripe width is too wide, the device cannot be self-pulsated. Conversely, when the vertical divergence angle is too broad, when the second conductive type first cladding layer is too thick and when the stripe width is too narrow, the device, though can be self pulsated, the operation current may be too large, and laser characteristics may be become worse. Therefore, some optimum range exists. When the purpose of use (e.g., where to set the divergence angle), materials (refractive index, resistance, or the like), and the like are changed, the optimum range will be shifted slightly. With such an optimum range, it should be reminded that the above structural parameters may affect each other. In this case, a proper vertical divergence angle exceeds 25° and less than 45°. In this invention, as another embodiment, high output operation can be made excellently when dp and W are formed with good controllability in a proper range as shown below.

W is preferably 2.2 microns or wider, more preferably 2.3 microns or wider, further preferably 2.5 microns or wider as a lower limitation and preferably 1000 microns or narrower as an upper limitation. To make the transverse mode to a single mode (a single peak beam distribution in the transverse direction), W is preferably 2.2 microns or wider, more preferably 2.3 microns or wider, further preferably 2.5 microns or wider as a lower limitation and preferably 5 microns or narrower, 4 microns or narrower, further preferably 3.5 microns or narrower as an upper limitation. A preferable semiconductor light-emitting device can be produced by adjusting W within a range having a lower limitation and an upper limitation which are respectively selected from the above depending on, for example, the intended use of the device. This reason is, if the stripe width is too broad, the transverse mode cannot oscillate with a single mode (a single peak beam distribution in the transverse direction), and conversely, if the stripe width is too narrow, the light density at the facet become large and the catastrophic optical damage (COD) level is lowered at the front facet, so that the device tends to be degradated when it is used at the high output operation. With respect to dp, it is preferably 0.10 micron or longer, 0.20 micron or longer, 0.25 micron or longer as a lower limitation and preferably 0.50 micron or shorter, more preferably 0.45 micron or shorter, further preferably 0.40 micron or shorter as an upper limitation. A preferable semiconductor light-emitting device can be produced by adjusting dp within a range having a lower limitation and an upper limitation which are respectively selected from the above depending on, for example, the intended use of the device. When the intended use (e.g., where to set the divergence angle), materials (refractive index, resistance, or the like), and the like are changed, the optimum range will be shifted slightly. With such an optimum range, it should be reminded that the above structural parameters may affect each other.

This invention is also applicable to various ridge waveguide type semiconductor light-emitting devices. For example, the invention can be combined with the embodiments as exemplified below.

(1) The current blocking layer made of a semiconductor, a dielectrics, or the like, preferably made of a semiconductor, is located further outside the protective film covering both sides of the stripe region, improves yield during cleavage and assembly, reduces the stresses to the ridge portion when the device is formed in a junction-down type and extends the life span.

(2) In use of a substrate having an off-angle to the surface with respect to the plane direction of a low degree, the light density distribution (beam profile) has a good symmetry in the transverse direction even if the ridge portion of the re-growth become asymmetric horizontally, and the device can oscillate with a basic transverse mode that is stable up to a high output and the device yield and reliance can be improved.

(3) By forming a structure having dummy ridge regions, in which the current blocking layer is formed, located further outside the protective film covering both sides of the stripe region, the thickness of the stripe portion, assembly and carrier concentration are controlled easily.

Hereinafter, embodiments are exemplified to illustrate the invention further in detail. The materials, regents, ratio, manipulations, and the like can be modified as far as not going against the spirits of the invention. Therefore, the scope of the invention is not limited to the following examples.

EXAMPLE 1

This example is shown in FIG. 1. On an n-type GaAs substrate 21 ($n=1\times10^{18}$) having a surface of (100) plane and a thickness of 350 μm, using an MOCVD method, an n-type cladding layer 11 made of a Si doped $Al_xGa_{1-x}As$ (x=0.55: $n=1\times10^{18}$ cm$^{-3}$) with a thickness of 1.5 μm, an active layer 12 made of a non-doped $Al_xGa_{1-x}As$ (x=0.14) with a thickness of 0.06 μm, a p-type first cladding layer 13 made of a Zn doped $Al_xGa_{1-x}As$ (x=0.55: $p=1\times10^{18}$ cm$^{-3}$) with a thickness of 0.25 μm, and an oxidation suppressive layer 15 made of a Zn doped $Al_xGa_{1-x}As$ (x=0.2: $p=1\times10^{18}$ cm$^{-3}$) with a thickness of 10 nm were formed in this order.

Subsequently, a SiNx film 31 as a protective film was deposited by 200 nm, and by a photolithography method, the SiNx film was remained in a stripe shape in a [01-1] B direction with a width of 22 μm. Herein, the direction of [01-1] B is defined as a surface that As appears on the surface of [11-1] plane existing between (100) plane and [01-1] plane. The repeating width L of the ridge portion was 250 μm each (D/L=0.088).

Using the MOCVD method, a current blocking layer 16 made of a Si doped GaAs ($n=1\times10^{18}$ cm$^{-3}$) having a thickness of 0.5 μm was selectively grown. Then, using a photolithography method, a stripe shaped opening with a width of 2.2 μm extending in [01-1]B direction was formed at a center of the stripe SiNx film.

A selective growth was made thereon using the MOCVD method, thereby forming, in a ridge stripe shape, a p-type second cladding layer 13a made of a Zn doped $Al_xGa_{1-x}As$ (x=0.57: $p=1\times10^{18}$ cm$^{-3}$) with a thickness of 1.25 μm and a p-type contact layer 14a made of a Zn doped GaAs ($p=1\times10^{19}$ cm$^{-3}$) with a thickness of 0.5 μm if grown entirely on an ordinary substrate. When the thickness of the cladding layer and the contact layer were measured by observations to the cross sections, the results indicated that the thicknesses were identical within a range of errors in comparison with a case that the films were grown entirely on an normal substrate.

Thereafter, p-side electrode is vaporized, and n-side electrode is vaporized after the substrate was made thinner down to 100 μm. Chips were cut out by cleavage from a wafer thus produced, and there was no damage due to cleavage, and there was no peeling of electrodes by assembling. When the near-field pattern was observed, light emitting was observed only around the ridge portion, and it was observed that the currents were squeezed only at the ridge portion by the current blocking layer.

Figure 6:
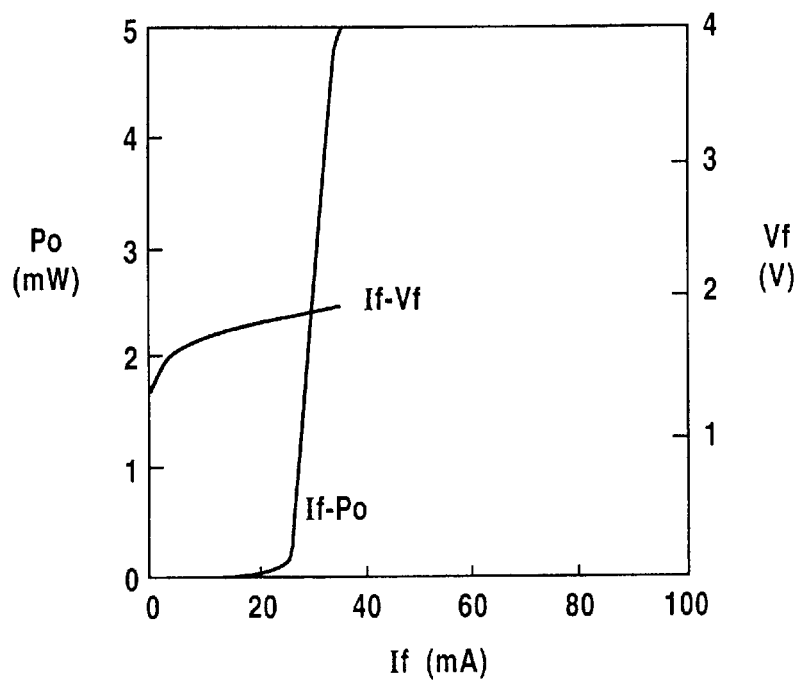
FIG. 6 is a graph showing current and voltage characteristics of a semiconductor light-emitting device produced according to an embodiment of the invention in which the ridge portion is produced by re-growth.

When the device was assembled in a junction-down type, very good characteristics of current versus voltage was observed as shown in FIG. 6, and it was confirmed that there was no current leakage to the dummy ridge region and the device has a good production yield.

Comparitive Example 1

A laser was produced with substantially the same processes as in Example 1. In this case, the semiconductor layer 16 as a current blocking layer was not grown selectively, but a SiNx insulating film was deposited on the p-type contact layer 14*a* with a thickness of 200 nm, and a stripe window of width of 10 microns extending in [0-1-0] A direction was opened in the SiNx film by using this photolithography method. The structure shown in FIG. 13 was produced in exactly the same way as those in Example 1 except the above steps.

As a result of cleavage and assembly, there raised problems such that the device had a bad cleavage property and that some parts the electrode and SiNx film were peeled because the SiNx film and electrodes were formed on the p-type surface. When the near-field pattern was observed, light emitting was observed all over the active layer due to the current leakage to the dammy ridge region, and many lasers were observed that the currents were not adequately squeezed by the insulation layer.

Figure 7:
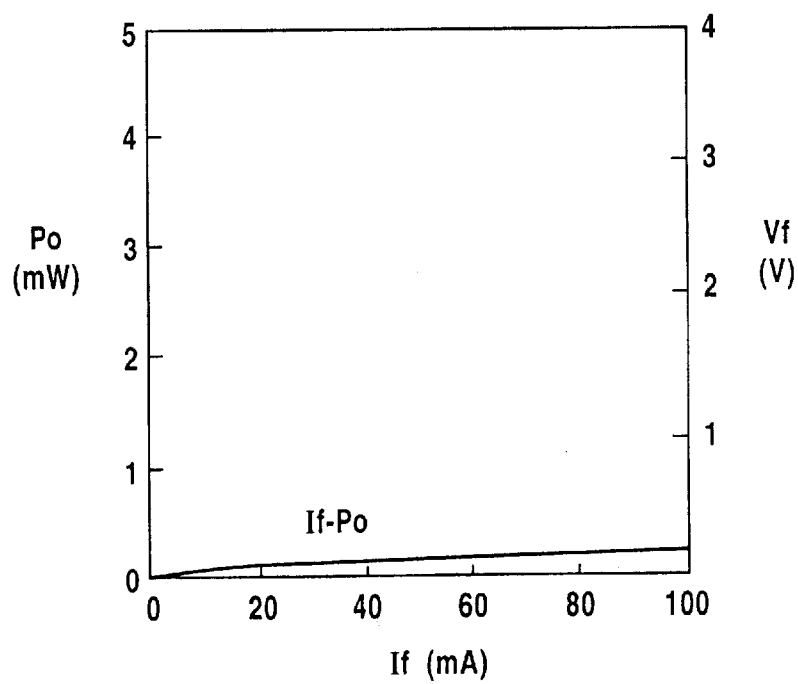
FIG. 7 is a graph showing current and voltage characteristics of a conventional semiconductor light-emitting device, as a comparative example, produced in which the ridge portion is produced by re-growth.

When the devise was assembled in a junction-down type, the currents were found to be leaking, and many were not measurable in respect to characteristics of current verses voltage as shown in FIG. 7. Because the ridge portion and the dummy ridge regions had almost the same thicknesses, the soldering material tended to cause degradation from a stress, so that the device could not obtain enough laser property and was suffered from a lower yield.

EXAMPLE 2

With substantially the same steps of the example 1, plural samples were made in the following conditions. The thickness of the active layer 12 was changed to 0.04 to 0.07 micron, and the thickness of p-type first cladding layer 13 was changed to 0.20 to 0.60 micron. A stripe shaped window was opened having a changed opening width (W) of 1.0 to 3.0 microns in [01-1] direction at a center of the SiN film of the stripe shape.

Chips were cut out by cleavage from the wafer thus produced, and after the devices were assembled in the junction-up type and were subject to a continuous wavefront (CW). Among the laser devices thus produced, the device having a active layer thickness of 0.06 micron, a p-type first cladding layer thickness of 0.325 micron, and a opening width (W) of 2.0 microns showed very good characteristics of current versus voltage and current versus output, and it was confirmed that no high resistance layer was formed because the threshold voltage was set to about 1.7 V, a lower amount as corresponding to a band gap of the active layer. The series resistance was small, 5 to 6Ω, and it was confirmed that the contact resistance was very small between the p-type contact layer and the p-type electrode.

The laser of this example realized the self-pulsation with 5 mW operation at both of 25° C. and 80° C. (coherency γ≦0.95). Excellent characteristics were shown such that the wavelength was 790 nm in average, that the threshold current was 26 mA in average, that the slope efficiency was 0.56 mW/mA in average. The vertical divergence angle was 35° in average, and the far-field pattern (beam divergence angle) was obtained as designed. It was also confirmed that the beam distribution was controlled in a very good way.

From those results, it was turned out that the laser structure of the invention satisfies a standard specification in the case of lower output lasers used for light sources for reading compact disc or the like as shown in Table 1. The device was confirmed to have a highly reliable MTTF (Median Time To Failure) of a hundred thousand hours or more and have less fluctuations in characteristics in batches or among batches, and it was turned out that the production yield was also close to 100%.

TABLE 1

| | |
|---|---|
| Threshold current $I_{th}$ | $I_{th} \leq 30$ mA |
| Threshold voltage $V_{th}$ | $V_{th} \leq 2.0$ V |
| Operation current $I_{op}$ | $I_{op} \leq 37$ mA |
| Operation voltage $V_{op}$ | $V_{op} \leq 2.3$ V |
| Slope efficiency SE | $0.4 \leq SE \leq 0.7$ |
| Vertical divergence angle $\theta_v$ | $30° \leq \theta_v \leq 42°$ |
| Horizontal divergence angle $\theta_h$ | $8° \leq \theta_h \leq 14°$ |
| Wavelength λ | 780 nm $\leq λ \leq$ 810 nm |
| Coherency γ | $γ \leq 0.95$ |
| At 25° C. 3 mW (except $I_{th}$, $V_{th}$). | |

When the W was 2.5 μm or more, the self-pulsation tended to be unavailable, and when the W was 3.0 μm or more, the self-pulsation was unavailable at all. On the other hand, when the W was 1.5 μm or less, the operation current increased, and when the W was 1.0 μm or less, the operation current was very high and went beyond the practical range. When th dp was 0.3 μm or less, the self-pulsation tended to be unavailable, and when the dp was 0.2 μm or less, the self-pulsation was unavailable at all.

When the dp was 0.45 μm or more, the operation current increased, and when the dp was 0.5 μm or more, the operation current was very high and went beyond the practical range. When the W was 1.5 μm or less or the dp was 0.45 μm or more, the polarization ratio (TE/TM) tended to be lowered, so that it would become inappropriate as a light source for optical disc such as magnet-optical disc (MO), mini-disc (MD) and the like using polarization of beams.

According to the experiments of Examples, it was turned out that the self-pulsation was not available when the active layer was too thin (or the vertical divergence angle was too narrow), when the second conductive type (p type) first cladding layer was too thin, or when the stripe width was too broad. Conversely, it was turned out that the specification shown in Table 1 might not be satisfied because the operation current might be so large even though the self-pulsation was available, when the active layer was too thick (or the vertical divergence angle was too broad), when the second conductive type (p type) first cladding layer was too thick, or when the stripe width was too narrow.

From the above things, to maintain the self-pulsation as well as to keep the operation current in a certain range, it was confirmed that there were respective suitable ranges for the vertical divergence angle, the second conductive type first cladding layer and the stripe width. More specifically, a desired vertical divergence angle is 25° to 45°, more preferably 29° to 42°, and further preferably, 32° to 40°. As the thickness dp of the second conductive type first cladding layer and the opening width W, dp is preferably 0.2 microns or longer, more preferably 0.25 microns or longer, further preferably 0.3 microns or longer as a lower limitation and preferably 0.5 microns or shorter, more preferably 0.47 microns or shorter, further preferably 0.4 microns or shorter as an upper limitation; W is preferably 1.0 micron or wider, more preferably 1.3 microns or wider, further preferably 1.5 microns or wider as a lower limitation and preferably 3.0 microns or narrower, more preferably 2.7 microns or narrower, further preferably 2.5 microns or narrower as an upper limitation. A preferable semiconductor light-emitting device can be produced by adjusting each of dp and W within a range having a lower limitation and an upper limitation which are respectively selected from thee above depending on, for example, the intended use of the device.

As a confirmed result of the simulation based on the experimental results in regard with a range that the opening width W and the thickness dp of the second conductive type first cladding layer satisfy the condition for self-pulsation, it was turned out that the effective refractive index step in the transverse direction in the active layer was required to set to approximately $2 \times 10^{-3}$ to $7 \times 10^{-3}$, and a ratio of beam encroachment to both sides of the ridge (Γact.out) was required to set to approximately 20 to 40%.

EXAMPLE 3

Figure 8A:
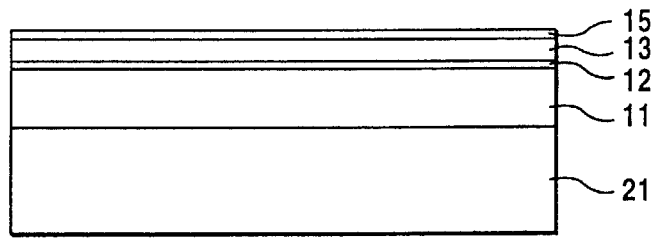
FIG. 8(a) is a cross section at a stage when a DH growth is finished for a semiconductor light-emitting device according to the third embodiment.
Figure 8B:
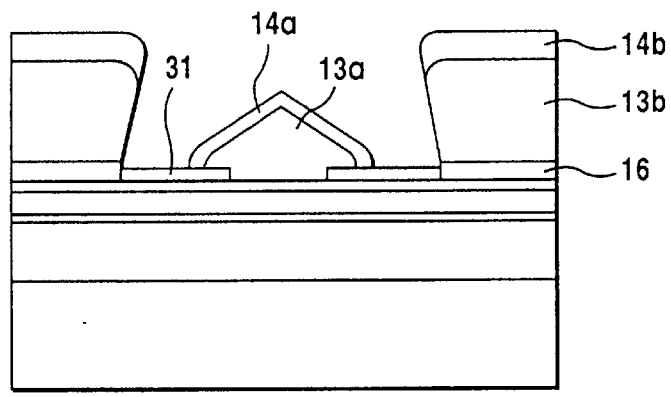
FIG. 8(b) is a cross section at a stage when a formation of a current blocking layer and re-growth of the ridge portion is finished for the semiconductor light-emitting device according to the third embodiment.
Figure 8C:
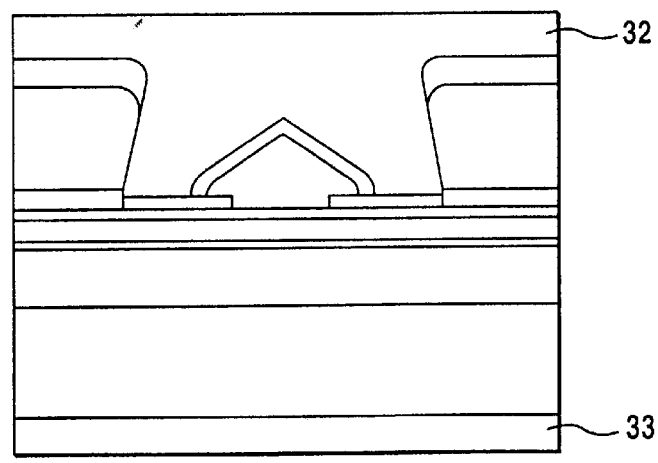
FIG. 8(c) is a cross section of the completed a semiconductor light-emitting device according to the third embodiment.

In this Example, a structure shown in FIG. 8 was produced.

The DH structure was formed by substantially the same steps as those in Example 1; the dummy ridge regions were formed; an opening in a stripe shape was opened in a center of the protective film 31. The active layer 12 was made of a double quantum well (DQW) active layer in which a guide layer made of non-doped $Al_{0.3}Ga_{0.7}As$ with a thickness of 10 nm, an $Al_{0.1}Ga_{0.9}As$ active layer with a thickness of 8 nm, a barrier layer made of $Al_{0.3}Ga_{0.7}As$ with a thickness of 5 nm, an $Al_{0.1}Ga_{0.9}As$ active layer with a thickness of 8 nm, and a guide layer with a thickness of 10 nm, formed in this order. The opening width in the stripe shape extending in [01-1] direction formed at a center of the SiN film in a stripe shape was 2.7 μm.

By a selective growth using an MOCVD method, a p-type second cladding layer 13a made of Zn doped p-type $Al_xGa_{1-x}As$ (x=0.60; p=$1 \times 10^{18}$ cm$^{-3}$) was grown with a thickness of 1.4 μm. This Zn doped p-type $Al_xGa_{1-x}As$ (x=0.60) second cladding layer presented a ridge form having a facet of mainly (311)A plane. Subsequently, a p-type contact layer 14a made of a Zn doped GaAs having a carrier concentration of $1 \times 10^{19}$ cm$^{-3}$ was formed thereon using an MOCVD method. This Zn doped GaAs contact layer was grown in an isotropic way on the ridge shaped p-type second cladding layer 13a made of the Zn doped $Al_xGa_{1-x}As$, and the p-type contact layer 14a was formed in covering the entire surface of the ridge portion with a thickness of 0.5 μm (FIG. 8(b)).

In the above MOCVD method, as the III group gas source, a trimethylgallium (TMG) and trimethylaluminum (TMA), and as V group gas source, an arsine, and as a carrier gas, hydrogen were used. Dimethylzinc (DEZ) was used as p-type dopants, and disilane was used as n-type dopants. During the growth of the ridge portion, an HCl gas was introduced at a mol ratio of HCl/III group of 0.12, particularly, a mol ratio of HCl/TMA of 0.22.

From an SEM observation, it was confirmed that the ridge shaped p-type second cladding layer (second conductive type second cladding layer) made of the Zn doped p-type $Al_xGa_{1-x}As$ (x=0.60) was formed in riding over the protective film made of SiNx by about 0.4 μm as shown in FIG. 8. The p-type GaAs contact layer covered the entire surface of all the ridge portion.

Figure 9:
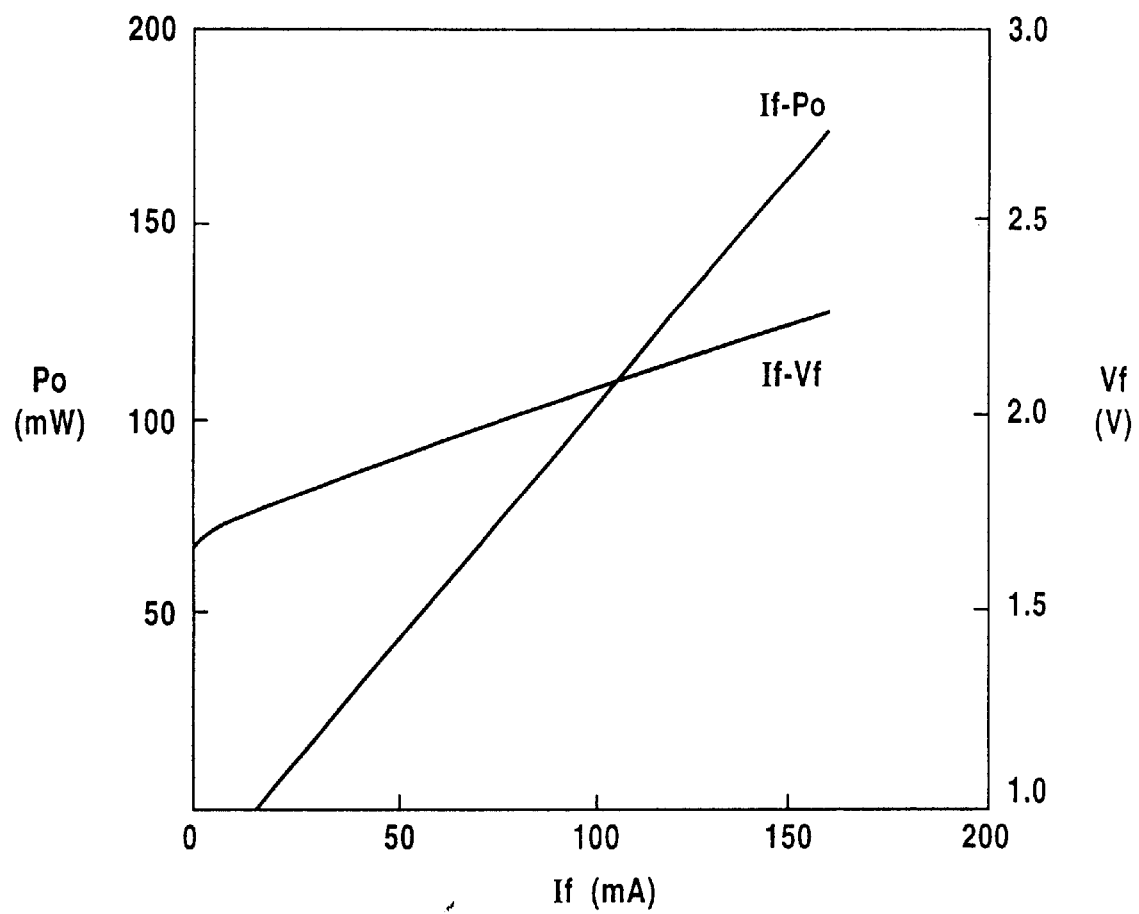
FIG. 9 is a graph showing current and voltage characteristics of the semiconductor light-emitting device produced according to the third embodiment.

Bars were cut out by cleavage from the wafer thus produced, and a laser resonator structure was formed. The length of the resonator was set to 400 μm at that time. After asymmetrical coating was made to a front facet 10% and rear facet 90%, the bars were separated by the secondary cleavage to each chip. After the device was assembled in a junction down type, the characteristics of current-beam output and current-voltage were measured upon continuous wavefront (CW) at a temperature of 25° C. FIG. 9 shows characteristics of the laser device thus produced. It was confirmed that the device showed very good characteristics of current-beam output and current-voltage, that the threshold voltage was 1.7 V, a lower amount corresponding to the band gap of the active layer, and that no high resistance layer exists. The series resistance is low, 4 to 5Ω, and it was confirmed that the contact resistance between the p-type contact layer and the p-type electrodes was very small. The laser of this example could achieved a high output up to beam output of 150 mW operation and had very good characteristics that the wavelength was 785 nm in average, that the threshold current was 15 mA in average, and that slope efficiency was 1.2 mW/mA in average. It was also confirmed that the vertical divergence angle was 23° in average, that a single peak far-field pattern (beam divergence angle) was obtained as designed, that the beam distribution was controlled in a very good way. In this specification, "single peak" does not means a situation permitting existence of only one peak but means that any other peaks having intensity of one tenth of the maximum peak do not exist. According to those results, the laser structure of the invention can be used for a light source for recording of optical discs such as CD-R, MD, and so on. High reliability was also confirmed, and fluctuations in characteristics in a batch or among batches were also turned out to be small.

Where the opening width was made wider than the above Examples, if it was 5 μm or wider, it was turned out that most of the devices do not oscillate with a single transverse mode (light intensity profile in the transverse direction of a single peak). Therefore, it is desirable to set the opening width 5 μm or less, to realize the single transverse mode oscillation.

Moreover, according to confirmed results of a simulation based on the experimental results in regard with a range that the device can be operated with a high output, it was turned out that the effective refractive index step in the transverse direction inside the active layer was required to be set at about $5 \times 10^{-3}$ to $1.3 \times 10^{-2}$.

What is claimed is:

1. A semiconductor light-emitting device comprising:
   a substrate;
   a first compound semiconductor layer including an active layer formed on the substrate;
   a second compound semiconductor layer comprising a ridge formed on the first compound semiconductor layer;
   a protective film formed above the first compound semiconductor layer on both sides of the second compound semiconductor layer;
   a current blocking layer formed above the first compound semiconductor layer outside the protective film, the current blocking layer being formed below a layer having the same layers as the second compound semiconductor layer has.

2. The semiconductor light-emitting device according to claim 1, wherein the current blocking layer is a semiconductor layer.

3. The semiconductor light-emitting device according to claim 2, wherein the current blocking layer is a first conductivity type semiconductor layer or a high resistance semiconductor layer.

4. The semiconductor light-emitting device according to claim 1, wherein the first compound semiconductor layer has layers, respectively formed above and below the active layer, having a smaller refractive index than that of the active layer.

5. The semiconductor light-emitting device according to claim 4, wherein the layer formed below the active layer having the smaller refractive index is a first conductivity type cladding layer, and the layer formed above the active layer is a second conductivity type first cladding layer.

6. The semiconductor light-emitting device according to claim 5, wherein the first compound semiconductor layer includes a second conductivity type first cladding layer formed above the active layer and an oxidation suppressive layer formed on the second conductivity type first cladding layer.

7. The semiconductor light-emitting device according to claim 1, wherein the second compound semiconductor layer includes a layer having a smaller refractive index than that of the active layer.

8. The semiconductor light-emitting device according to claim 7, wherein the second compound semiconductor layer includes a second conductivity type second cladding layer having a smaller refractive index that of the active layer.

9. The semiconductor light-emitting device according to claim 1, wherein a contact layer is formed on substantially the entire surface of a ridge portion of the second compound semiconductor layer.

10. The semiconductor light-emitting device according to claim 5, wherein the protective film has an opening and the second compound semiconductor layer is formed in the opening.

11. The semiconductor light-emitting device according to claim 1, wherein no protective film is formed on a side surface of the ridge portion of the second compound semiconductor layer.

12. The semiconductor light-emitting device according to claim 1, wherein the semiconductor light-emitting device is a self-pulsation type semiconductor laser.

13. The semiconductor light-emitting device according to claim 1, wherein the semiconductor light-emitting device is a semiconductor laser.

* * * * *